United States Patent
Zhang et al.

(10) Patent No.: US 10,374,632 B2
(45) Date of Patent: Aug. 6, 2019

(54) LOW DENSITY PARITY CHECK CODED MODULATION FOR OPTICAL COMMUNICATIONS

(71) Applicants: NEC Laboratories America, Inc., Princeton, NJ (US); NEC Corporation, Tokyo (JP)

(72) Inventors: Shaoliang Zhang, Princeton, NJ (US); Fatih Yaman, Princeton, NJ (US); Ting Wang, West Windsor, NJ (US); Yoshihisa Inada, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 15/729,110

(22) Filed: Oct. 10, 2017

(65) Prior Publication Data

US 2018/0102791 A1    Apr. 12, 2018

Related U.S. Application Data (60) Provisional application No. 62/406,081, filed on Oct. 10, 2016.

(51) Int. Cl.
*H03M 13/11* (2006.01)
*H03M 13/29* (2006.01)
(Continued)

(52) U.S. Cl.
CPC ...... *H03M 13/116* (2013.01); *H03M 13/1171* (2013.01); *H03M 13/2906* (2013.01);
(Continued)

(58) Field of Classification Search
CPC ........... H03M 13/116; H03M 13/2906; H03M 13/616; H03M 13/2792; H04B 10/27; H04L 1/0041; H04L 1/0045
See application file for complete search history.

(56) References Cited

U.S. PATENT DOCUMENTS 8,065,598 B1 * 11/2011 Gunnam .............. H03M 13/116
                                                        714/800
8,938,660 B1 *  1/2015 Varnica ................. H03M 13/00
                                                        714/755
(Continued)

OTHER PUBLICATIONS

Magarini, et al., Concatenated Coded Modulation for Optical Communications Systems, IEEE Photonics Technology Letters, Aug. 2010, 1244-1246, vol. 22, No. 16.
(Continued)

*Primary Examiner* — Kyle Vallecillo
(74) *Attorney, Agent, or Firm* — Joseph Kolodka (57) ABSTRACT

Systems and methods for data transport in optical communications systems, including a transmitter for encoding a received information sequence by constructing an outer and inner quasi cyclic-low-density parity check (QC-LDPC) code. The encoding includes dividing the received information sequence into a plurality of messages of equal length, encoding each of the messages into a codeword to generate a plurality of outer codewords, cascading the plurality of outer codewords to generate a bit sequence, and executing inner encoding to encode each of the plurality of outer codewords into codewords in QC-LDPC inner code. A receiver decodes a received data stream based on the QC-LDPC inner code using two-phase decoding including iteratively performing at least one of inner/outer and outer/inner decoding until a threshold condition is reached.

20 Claims, 7 Drawing Sheets

(51) Int. Cl.
  *H03M 13/00* (2006.01)
  *H04L 1/00* (2006.01)
  *H04B 10/27* (2013.01)
  *H04B 10/516* (2013.01)
  *H04B 10/61* (2013.01)
  *H03M 13/27* (2006.01)

(52) U.S. Cl.
  CPC ..... *H03M 13/2957* (2013.01); *H03M 13/616* (2013.01); *H04B 10/27* (2013.01); *H04B 10/516* (2013.01); *H04B 10/616* (2013.01); *H04L 1/005* (2013.01); *H04L 1/0041* (2013.01); *H04L 1/0045* (2013.01); *H04L 1/0058* (2013.01); *H04L 1/0065* (2013.01); *H03M 13/2792* (2013.01)

(56) References Cited

U.S. PATENT DOCUMENTS

2008/0025424 A1\* 1/2008 Yang ................ H04L 1/0045
  375/260
2011/0222854 A1\* 9/2011 Roberts ............. H04B 10/532
  398/70

OTHER PUBLICATIONS

Sugihara, et al., A Spatially-coupled Type LDPC Code with an NCG of 12 dB for Optical Transmission beyond 100 Gb/s, OFC/NFOEC Technical Digest OSA, Mar. 2013, 3 pages.

\* cited by examiner

LOW DENSITY PARITY CHECK CODED MODULATION FOR OPTICAL COMMUNICATIONS

RELATED APPLICATION INFORMATION

This application claims priority to U.S. Provisional Application No. 62/406,081, filed on Oct. 10, 1016, incorporated herein by reference herein its entirety.

BACKGROUND

Technical Field

The present invention relates to coded modulation, and more particularly to quasi-cyclic (QC) Low Density Parity Check (LDPC) coded modulation with serial turbo decoding for data transport in optical communications systems.

Description of the Related Art

Digital coherent technology has made 100G over transoceanic distance using quadrature phase-shifted-keying (QPSK) become commercially available to improve spectral efficiency. However, when further increasing the spectral efficiency beyond QPSK, the distance is much shorter due to the high required signal-to-noise ratio (SNR). The conventional state-of-the-art forward error correction (FEC) is using capacity-approaching low density parity check (LDPC) codes at 20%-30% OH content, which improves the FEC limit Q to about ~5 dB Q with less than 12 dB net coding gain (NCG). Even though conventional systems and methods have used 8 quadrature amplitude modulation (8QAM) for transpacific cables, the system margin is still barely above the FEC limit, and thus is unreliable, and risky to use due to the higher fiber loss from aging and cable cut/repair.

Different coding methods have been proposed to increase the NCG, and to lower the error floor. For example, conventional systems and methods include a concatenated system considering two block codes as an outer code. These codes include a 16 times interleaved byte-oriented (255,239) Reed Solomon (RS) code and a code consisting of two interleaved extended three-error correcting Bose Chaudhuri Hocquenghem (BCH) (1020,988) codes that achieves an NCG of 8.42 dB at a bit-error rate of $10^{-13}$ and the NCG of 9.7 dB when the concatenated code based on the two interleaved BCH codes is used as the outer code. Some conventional methods propose the concatenation of a spatially-coupled type irregular LDPC code with a BCH code with an NCG of 12.0 dB at a BER of $10^{-15}$, with 25.5% redundancy. They proposed a spatially-coupled-like LDPC code to achieve a better error-floor performance than common spatially-coupled LDPC code.

SUMMARY

According to an aspect of the present principles, a method is provided for data transport in optical communications systems, including a transmitter for encoding a received information sequence by constructing an outer and inner quasi cyclic-low-density parity check (QC-LDPC) code. The encoding includes dividing the received information sequence into a plurality of messages of equal length, encoding each of the messages into a codeword to generate a plurality of outer codewords, cascading the plurality of outer codewords to generate a bit sequence, and executing inner encoding to encode each of the plurality of outer codewords into codewords in QC-LDPC inner code. A receiver decodes a received data stream based on the QC-LDPC inner code using two-phase decoding including iteratively performing at least one of inner/outer and outer/inner decoding until a threshold condition is reached.

According to another aspect of the present principles, a system is provided for data transport in optical communications systems, including a transmitter for encoding a received information sequence by constructing an outer and inner quasi cyclic-low-density parity check (QC-LDPC) code. The encoding includes dividing the received information sequence into a plurality of messages of equal length, encoding each of the messages into a codeword to generate a plurality of outer codewords, cascading the plurality of outer codewords to generate a bit sequence, and executing inner encoding to encode each of the plurality of outer codewords into codewords in QC-LDPC inner code. The transmitter transmits a data stream in accordance with the QC-LDPC inner code over a transmission medium.

According to another aspect of the present principles, a system is provided for data transport in optical communications systems, including a receiver for decoding a received data stream based on a QC-LDPC inner code using two-phase decoding, the decoding comprising iteratively performing at least one of inner/outer and outer/inner decoding until a threshold condition is reached. The inner/outer decoding includes setting a maximum number of inner decoding iterations, and checking a syndrome of a decoded word based on a parity check matric of the inner code at the end of each inner decoding iteration, setting a maximum number of outer decoding iterations, and decoding all failed words outputted by the inner decoder. The inner/outer decoding is iteratively performed until the entire decoding is successful or a preset maximum number of overall inner/outer decoding iterations is reached.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 7 is a block/flow diagram illustrating a high-level method for optical communication using quasi-cyclic (QC)

Low Density Parity Check (LDPC) coded modulation with serial turbo decoding, in accordance with the present principles.

DETAILED DESCRIPTION OF PREFERRED EMBODIMENTS

In accordance with the present principles, systems and methods are provided for data transport using quasi-cyclic (QC) Low Density Parity Check (LDPC) coded modulation with serial turbo decoding.

In one embodiment, the present invention enables transmission of 8QAM over transoceanic distances using an LDPC coding method for optical communication which achieves a very low error rate and error-floor (e.g., $10^{-15}$) with a net coding gain (NCG) greater than 12 dB at bit error rate of $10^{-15}$ in accordance with the present principles.

The LDPC coding method may include, for example, a structured quasi-cyclic (QC) LDPC code of length 8000 bits and rate 0.7, which achieves a bit error rate (BER) of $10^{-15}$ or lower with an NCG greater than 12 dB. The LDPC code may be constructed by concatenating a powerful cyclic projective geometry (PG) LDPC code as the outer code and a high-rate QC-LDPC code as the inner code.

In one embodiment, the outer code has a large minimum distance of, for example, 34, and its Tanner graph includes no small harmful trapping sets smaller than, for example, 30. By performing iterative decoding based on belief-propagation in accordance with the present principles, the generated LDPC code achieves a very low error of $10^{-15}$ BER. In accordance with various embodiments, two general methods for decoding the concatenated (8000, 5600) QC-LDPC code may be employed. It may be assumed that both outer and inner encodings are systematic, (e.g., information bits in a codeword, outer and inner, are followed by parity-check bits). The data may be decoded in two phases, and the two-phase decoding can be carried out in two different manners: (1) inner/outer decoding; and (2) outer/inner decoding. Both decoding methods may be considered to be a form of serial turbo decoding, and each decoding phase may be performed iteratively using, for example, an iterative bit flipping (BP)-algorithm.

In one embodiment, with respect to the generated PG(1057,813) code, each variable node (VN) in its tanner graph exhibits a very large connectivity and receives extrinsic information from, for example, 1256 other VNs in each decoding iteration and has a faster rate of decoding convergence than conventional systems and methods. The inner code used may be a (6, 80)-regular (8000, 7400) QC-LDPC code constructed based on the prime field Galois Field (GF)(101), and each VN in its Tanner graph may be connected to 474 other VNs by paths of length 2 in accordance with the present principles. This large VN-connectivity results in fast information exchange in each decoding iteration and thus enables improved decoding convergence as compared to conventional systems and methods. Concatenation of these two codes may result in an (8000, 5600) QC-LDPC code with rate 0.7 and a large minimum distance. In one embodiment, a Min Sum Algorithm (MSA) may be employed to decode data, and the MSA requires mainly real additions. Since an optimized scaled MSA performs just as well as a Sum Product Algorithm (SPA) and requires much less computational complexity, the scaled MSA may be utilized for decoding both the inner and outer codes to achieve the best error performance in accordance with the present principles.

In one embodiment, outer code may be decoded with various simple decoding algorithms (e.g., one-step majority-logic decoding, BF, weighted bit flipping (WBF), reliability-based iterative majority-logic decoding (RBI-MLGD), etc.). The use of any such simplified decoding algorithms reduces the overall decoding complexity significantly, with only minimal performance degradation. Additionally, a reduced-complexity revolving iterative decoding (RID) scheme can be used to reduce the hardware decoder complexity significantly without any significant performance loss for any decoders in accordance with various embodiments of the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
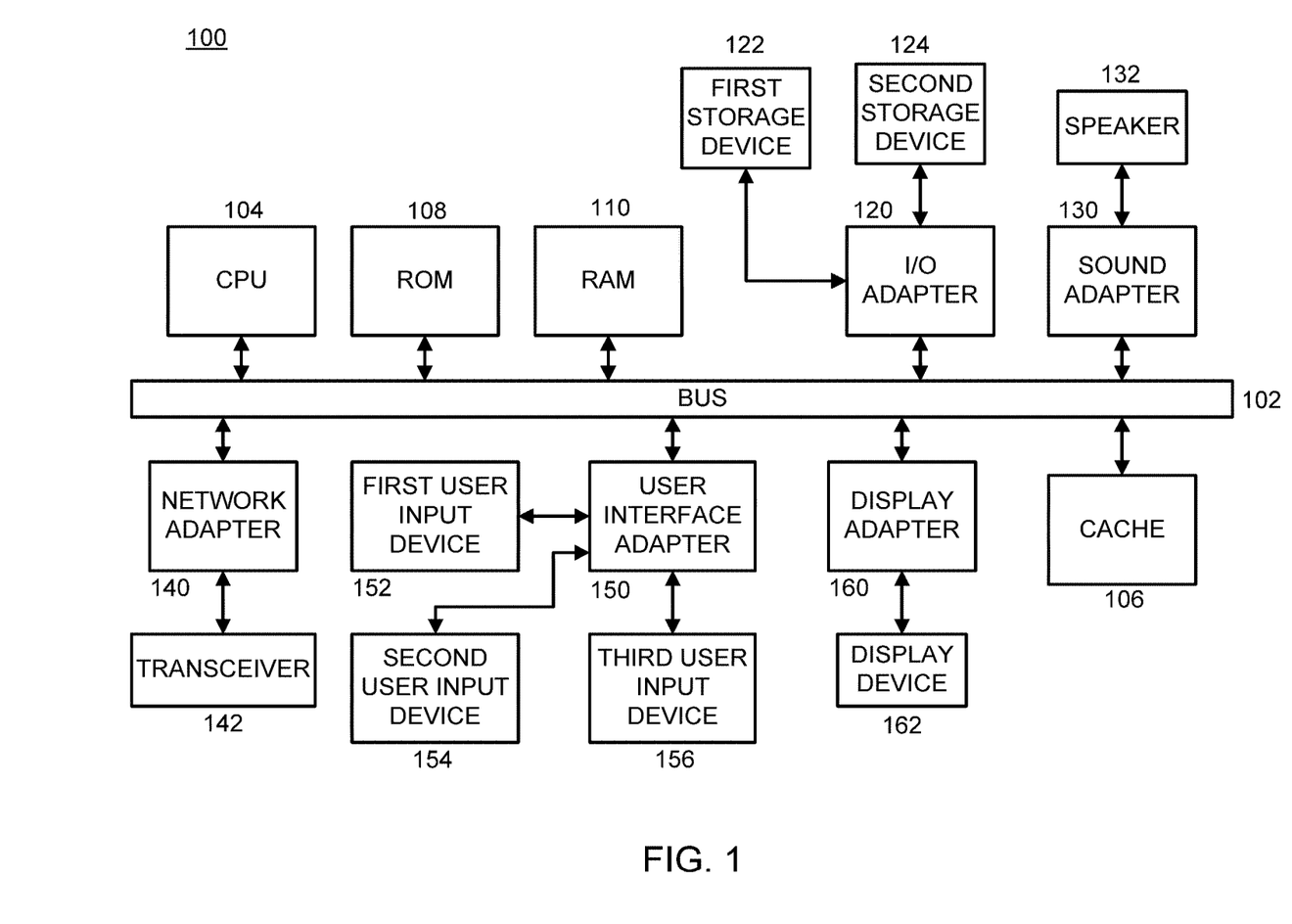
FIG. 1 is a block diagram illustrating an exemplary processing system to which the present principles may be applied, in accordance with the present principles.

Referring now in detail to the figures in which like numerals represent the same or similar elements and initially to FIG. 1, an exemplary processing system 100, to which the present principles may be applied, is illustratively depicted in accordance with an embodiment of the present principles. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Moreover, it is to be appreciated that systems 500 and 600 described below with respect to FIGS. 5 and 6, respectively, are systems for implementing respective embodiments of the present principles. Part or all of processing system 100 may be implemented in one or more of the elements of systems 500 and 600.

Further, it is to be appreciated that processing system 100 may perform at least part of the method described herein including, for example, at least part of methods 200, 300, 400, and 700 of FIGS. 2, 3, 4, and 7, respectively. Similarly, part or all of systems 500 and 600 may be used to perform at least part of methods 200, 300, 400, and 700 of FIGS. 2, 3, 4, and 7, respectively.

Figure 2:
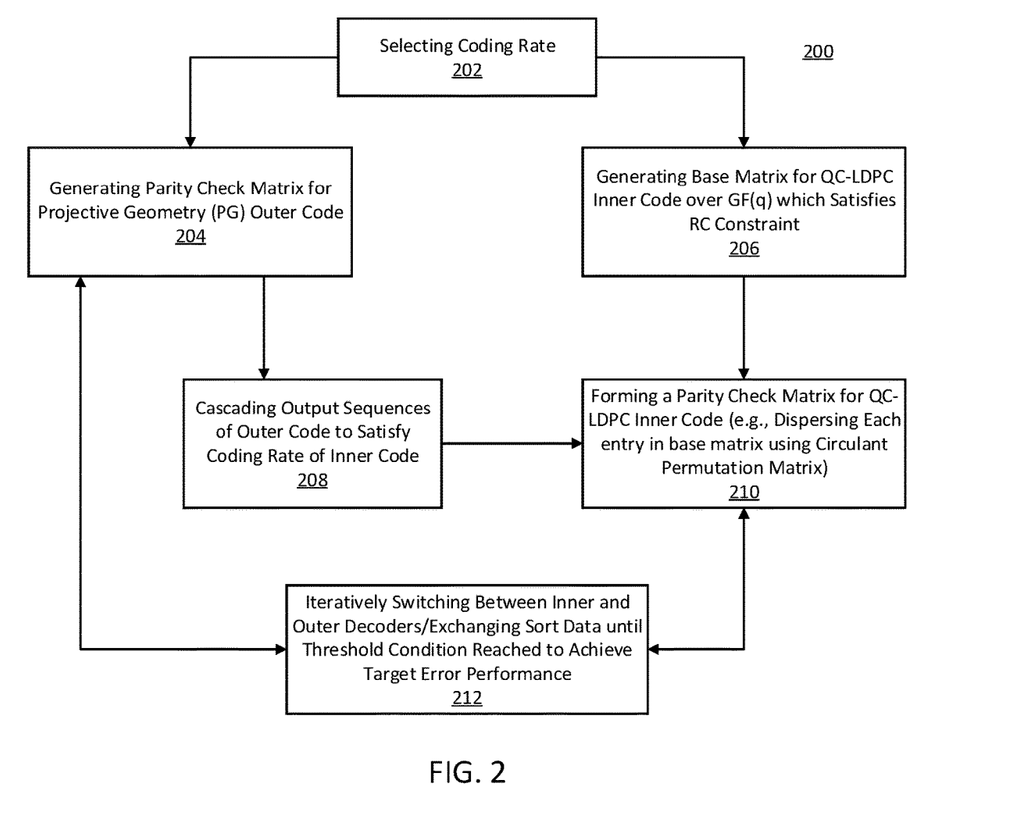
FIG. 2 is a block/flow diagram illustrating a method for data transport using quasi-cyclic (QC) Low Density Parity Check (LDPC) coded modulation with serial turbo decoding, in accordance with the present principles.

Referring now to FIG. 2, a method 200 for data transport across optical communications networks using quasi-cyclic (QC) Low Density Parity Check (LDPC) coded modulation is illustratively depicted in accordance with an embodiment of the present principles. In one embodiment, outer and inner LDPC codes may be constructed such that the codes satisfy row-column (RC) constraints and include a girth of at least 6.

In block 202, any of a plurality of target coding rates may be selected in accordance with the present principles. For simplicity of illustration, we may assume that the selected initial coding rate is 0.7 for the construction of an (8000, 5600) LDPC code, although other code rates may be employed according to various embodiments of the present principles.

In block 204, a parity check matric for PG outer code, which is cyclic and simple to implement, is generated in accordance with the present principles. In an exemplary embodiment, a PG (1057, 813) over a Galois Field (GF)($2^5$) may be constructed, and this satisfies row-column (RC) constraints, with code rate of 0.769 and minimum distance of 34. Furthermore, its Tanner graph has no small harmful trapping set with size less than 30 according to various embodiments. In block 206, a base matric may be generated for a QC-LDPC inner code over GF(q) which satisfies one or more RC constraints (e.g., girth is at least 6). For example, in block 206, based on a code rate of 0.7, a base matrix may be formed over GF(101).

In block 206, in accordance with one embodiment of the present principles, the base matrix design and generation may be performed as follows:
α is considered as a primitive element of GF(101).
The powers of α, $\alpha^0, \alpha^1, \alpha^2, \ldots, \alpha^{99}$, give all the nonzero elements of GF(101) and $\alpha^{100}=\alpha$.
The zero element of GF(101) is presented by $\alpha^{-\infty}$, i.e., $0=\alpha^{-\infty}$.
Forming the following 101×101 matrix over GF(101):

$$B = \begin{bmatrix} a^{-\infty}-a^{-\infty} & a^0-a^{-\infty} & a^1-a^{-\infty} & \ldots & a^{99}-a^{-\infty} \\ a^{-\infty}-a^0 & a^0-a^0 & a^1-a^0 & \ldots & a^{99}-a^0 \\ a^{-\infty}-a^1 & a^0-a^1 & a^1-a^1 & \ldots & a^{99}-a^1 \\ \vdots & \vdots & \vdots & & \vdots \\ a^{-\infty}-a^{99} & a^0-a^{99} & a^1-a^{99} & \ldots & a^{99}-a^{99} \end{bmatrix} \quad (1)$$

where the entries on the main diagonal are zeroes. This matrix is a Latin square over GF(101) of order 101 in which every element in GF(101) appears in each row and each column once. In this matrix, each 2×2 submatrix of B is non-singular. This structural property is referred to hereinafter as a 2×2 submatrix (SM) constraint. In one embodiment, a 6×80 submatrix B (6, 80)=$[b_{i,j}]_{0 \leq i \leq 6, \ 0 \leq j \leq 80}$ may be taken from B, thus avoiding the 0-entries on the main diagonal of B, where bij is the entry of submatrix at ith row, jth column.

In block 210, a parity check matrix may be formed for QC-LDPC inner code by dispersing each entry in the base matrix using a circulant permutation matrix in accordance with the present principles. In one embodiment, B may be used as a base matrix to construct the (6, 80)-regular (8000, 7400) QC-LDPC code as the inner code. The null space of H(6, 80) gives a (6, 8)-regular (8000, 7400) QC-LDPC code Cin with rate 0.925 whose Tanner graph has girth at least 6 and Variable Node-connectivity 474.

In one embodiment, in block 210, a unique QC-LDPC code may be constructed using B in accordance with the present principles as follows:
For 0≤i<100, the nonzero field element $\alpha^i$ may be represented by a circulant permutation matrix (CPM) of size 100×100 (e.g., with columns and rows labeled from 0 to 99) whose generator (or top row) has a single 1-component at the position i. This CPM may be denoted by $A(\alpha^i)$.

The zero element $0=\alpha^{-\infty}$, may be represented by a zero matrix (ZM) of size 100×100, which may be denoted by $A(\infty^{-\infty})$.

In one embodiment, the matrix representation of a field element may be referred to as the CPM-dispersion, and the CPM-dispersion of a field element in GF(101) is unique. The inverse of the CPM-dispersion $A(\alpha^i)$ gives the field element $\alpha^i$. Hence, the mapping defined by the CPM-dispersion in accordance with the present principles is one-to-one.

In block 208, x information output sequences of outer code may be cascaded to satisfy the coding rate of inner code in accordance with one embodiment of the present principles.

Figure 3:
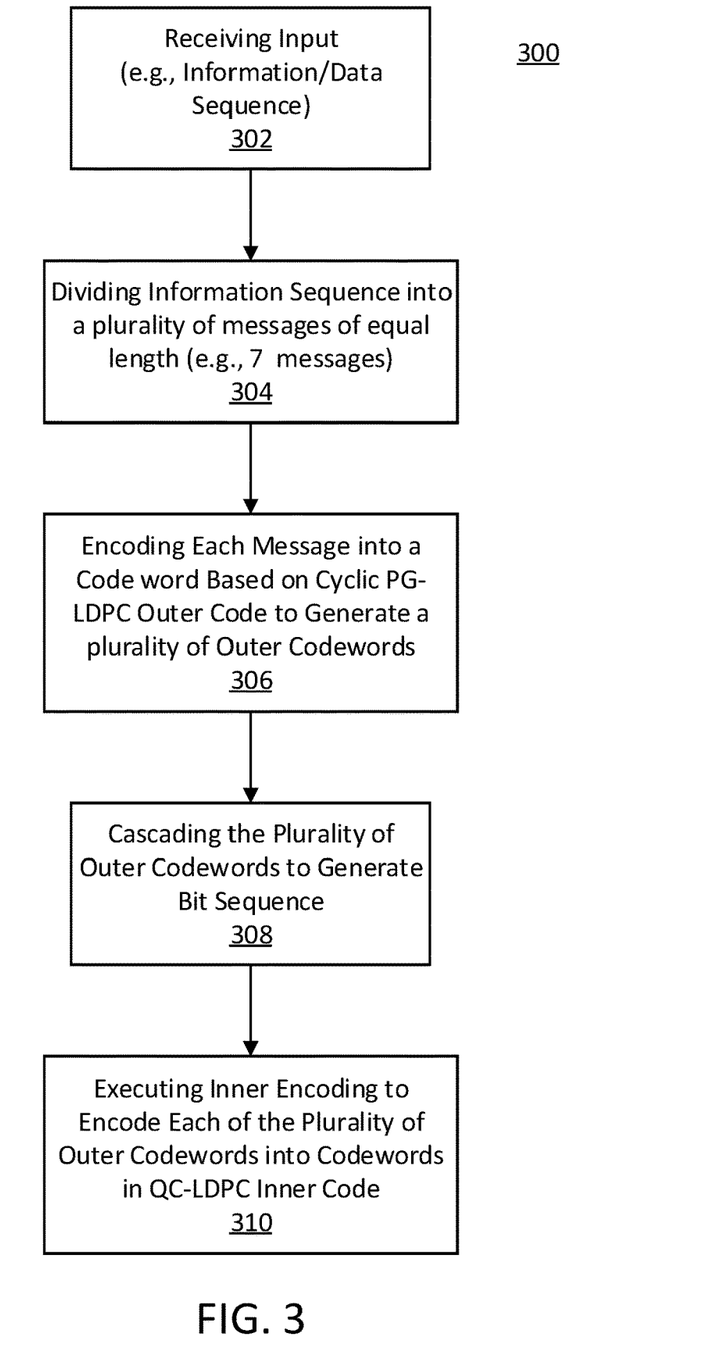
FIG. 3 is a block/flow diagram illustrating a method for encoding data for transport using quasi-cyclic (QC) Low Density Parity Check (LDPC) coded modulation with inner/outer encoding, in accordance with the present principles.

Referring now to FIG. 3, with continued reference to FIG. 2, a method 300 for encoding data for transport using quasi-cyclic (QC) Low Density Parity Check (LDPC) coded modulation with inner/outer encoding is illustratively depicted in accordance with an embodiment of the present principles. In an illustrative embodiment, the input of inner code from block 208 may be 7400 bits. In block 302, an information (e.g., data) sequence of 5691 bits may be taken from the input of inner code of 7400 bits. In block 302, since the code word v includes 5691 information bits (e.g., the output sequence of the source), the above concatenation results in a (8000, 5691) concatenated QC-LDPC code (Cc), with rate 0.711 in accordance with the present principles.

In one embodiment, in block 304, the information sequence may be divided into a plurality of messages of equal length, which for illustrative purposes may be assumed to be 7 messages of equal length, each having 813 bits. In accordance with one embodiment, the above-mentioned code rate (e.g., 0.711) can be further improved (e.g., to 0.7) by taking 5600 information bits and divide this into 7 messages, each having 800 information bits. In block 306, each message may be encoded into a code word based on a cyclic PG-LDPC outer code to generate a plurality of codewords. For example, in one embodiment, each message may be encoded into a code word of 1057 bits based on the (1057, 813) cyclic PG-LDPC outer code $C_{outer}$, resulting in 7 codewords in $C_{outer}$ in accordance with the present principles. This may be serial to parallel (e.g., 1×5691 to 7×813). In one embodiment, before the outer code encoding in block 306, 13 zero bits may be added to each message to obtain an augmented message of length 813 bits. This outer encoding may be, for example, PG (1057, 813). Each of the 7 augmented messages may be encoded into a codeword in the outer code $C_{outer}$.

In block 308, the plurality of outer codewords may be cascaded to generate a bit sequence in accordance with the present principles. In some embodiments, the cascading in block 308 may include, for example cascading 7 codewords to obtain a sequence of 7399 bits. Adding a zero bit (e.g., a fill-in bit) to this sequence, a sequence m of 7400 bits is obtained. This may be parallel to serial (e.g., 7×1057 to 1×7399) and one zero bits may be added.

In block 310, inner encoding may be executed to encode each of a plurality of outer codewords into codewords in QC-LDPC inner code. In one embodiment, inner encoding may be performed to encode 7 outer codewords, plus a fill-in zero bit, into a codeword in the (8000, 7400) QC-LDPC inner code $C_{in}$. This codeword includes 5600 information bits in every 8000 transmitted bits. Thus, the above encoding process results in an (8000, 5600) concatenated code with an improved rate of 0.7 (e.g., target code). Although the concatenated code rate of 0.7 is illustratively depicted in accordance with one embodiment, it is to be appreciated that the present principles may be applied to achieve any of a plurality of code rates in accordance with various embodiments. This inner encoding may result in, for example, 1×8000.

Referring again to FIG. 2, in block 212, two-phase decoding may be performed in accordance with the present principles, and it may be assumed that both outer and inner encodings are systematic (e.g., information bits in a codeword, outer and inner, are followed by parity-check bits). In one embodiment, a target error performance may be achieved by iteratively switching between inner and outer decoders, and exchanging soft data until a threshold condition is met in accordance with the present principles. Soft data means that there is probability associated with the data. For example, the received bit is likely to be 1 with 90% probability or 0 with 30% probability in accordance with one embodiment of the present principles.

In one embodiment, 8000 received bits may be decoded in two phases. The two-phase decoding can be carried out in two different manners: (1) Inner/outer decoding; and/or (2) Outer/inner decoding in accordance with the present principles. Both decoding methods may be considered to be serial turbo decoding, and each decoding phase may be performed iteratively using, for example, an iterative BP method in accordance with various embodiments. The decoding in block 212 will be described in further detail hereinbelow with reference to FIG. 4.

Figure 4:
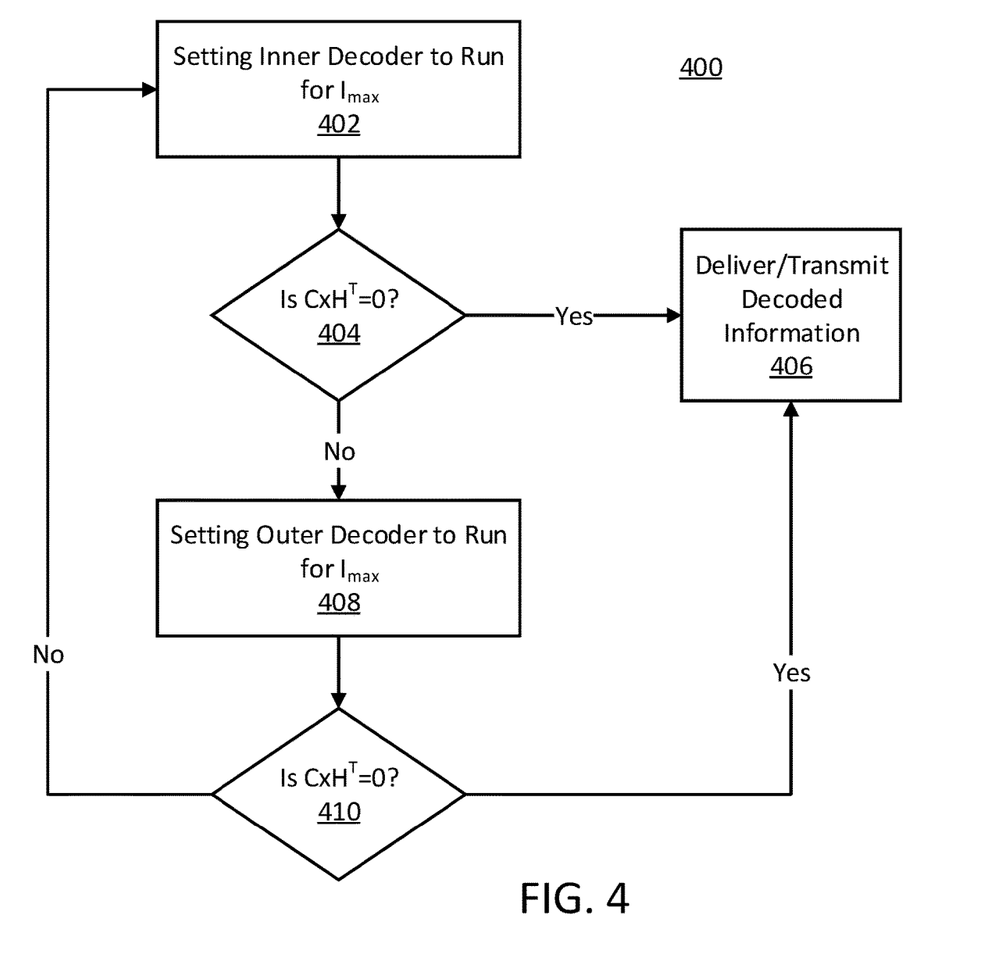
FIG. 4 is a block/flow diagram illustrating a method for decoding received data streams using inner/outer two-phase decoding, in accordance with the present principles.

Referring now to FIG. 4, with continued reference to FIG. 2, a method 400 for decoding received data streams using inner/outer two-phase decoding is illustratively depicted in accordance with an embodiment of the present principles. As described above, the two-phase decoding in block 212 can be carried out in two different manners: (1) Inner/outer decoding; and/or (2) Outer/inner decoding in accordance with the present principles. For illustrative purposes, the decoding will initially be described with respect to the Inner/outer decoding in accordance with the present principles.

In one embodiment, in block 402, the inner decoder may be set to run for a selected maximum number of inner decoding iterations to $I_{in,max}$. In block 404, at the end of each inner decoding iteration, the syndrome $S_{in}$ of the decoded word 'w' may be check based on parity-check matrix H of the inner code. For example, if $S_{in}=0$, then 'w' is codeword in $C_{in}$. If $S_{in} \neq 0$, we continue the inner iterative decoding until either the decoded word is a codeword in $C_{in}$ or the preset maximum number $I_{in,max}$ of inner decoding iterations is reached. If a codeword in $C_{in}$ is obtained during the inner decoding phase, we remove all the inner parity-check bits and the fill-in zero bit. This gives 7 decoded words $y_0$, $y_1$, ..., $y_6$ for the 7 transmitted outer codewords in $C_{outer}$.

If $C \times H^T=0$ in block 404 the decoded information may be delivered/transmitted in block 406 in accordance with the present principles. In block 406, for each of the 7 decoded word $y_i$, its syndrome $S_{outer,1}$ may be computed in accordance with the present principles. If all the syndromes are zero, then $y_0$, $y_1$, ..., $y_6$ are codewords in the outer code $C_{outer}$. In this case, the entire decoding process may be stopped. We then remove all the parity bits and the 91 fill-in zero bits from the 7 decoded outer codewords and deliver the 5600 decoded information bits to the user. If any of the syndrome of any of the 7 decoded codewords is not zero, the outer code decoder is activated in block 408 to perform decoding on the decoded words whose syndromes are not zero, one at a time. These words are referred as failed words.

If C×H$^T$≠0 in block 404, then an outer decoder may be set to run for I$_{max}$ in block 408. In block 408, maximum number of outer decoding iterations may be set to I$_{outer,max}$. If the outer code decoding of all the failed words outputted by the inner decoder is successful, all the parity bits may be removed and fill-in zero bits may be added from all the decoded outer codewords and deliver the 5600 decoded information bits to the user in block 406. If C×H$^T$≠0 in block 410, then the decoding may be iterated and proceed again to block 402 in accordance with various embodiments. If the decoding of any failed word at the output of the inner decoder is unsuccessful in block 408, we switch back to the inner code decoding with the decoded information and the channel information as input to decode the received word again in block 402 in accordance with the present principles.

The inner/outer decoding method 400 may be performed iteratively until a threshold condition is met (e.g., the entire decoding is successful, a preset maximum number I$_{inner/outer}$ of overall inner/outer decoding iterations is reached, etc.) in accordance with various embodiments of the present principles. In one embodiment, with the inner/outer decoding of the concatenated code, the outer decoding may be used to correct any residual errors that the inner decoder fails to correct in accordance with the present principles.

The method 400 may also perform Outer/inner decoding in accordance with various embodiments. For illustrative purposes, the Outer/inner decoding may be performed in an opposite manner to inner/outer decoding, and the concatenated LDPC code may be decoded in a reverse order (e.g., outer decoding before inner decoding). In an exemplary embodiment, each concatenated codeword is in systematic form, and includes 7 outer codewords (in systematic form) followed by 600 parity bits of the (8000, 7400) QC-LDPC inner code C$_{in}$. In this embodiment, outer decoding is carried out as soon as a word of 1057 symbols corresponding to a transmitted outer codeword is received. The decoding of each received outer codeword is based on the outer parity-check matrix H$_{PG}$. If errors spread out among the 7 received outer codewords and number of errors in each received outer codeword are not larger than 16, outer decoding will recover all 7 transmitted outer codewords, and in this case, inner decoding may be avoided. If outer decoding fails to give 7 correctly decoded outer codewords, inner iterative-BP decoding may then be activated and performed in accordance with the present principles. The rest of the decoding process for outer/inner decoding is the same as the inner/outer decoding described above. The outer/inner decoding is effective for correcting local errors in accordance with various embodiments of the present principles. Referring now to FIG. 5, a system 500 for data transport using quasi-cyclic (QC) Low Density Parity Check (LDPC) coded modulation with serial turbo decoding is illustratively depicted in accordance with an embodiment of the present principles.

In one embodiment, the system 500 may include a coding rate selector 510 for selecting a code rate (e.g., target code rate). A parity check matrix generator 520 may generate a parity check matrix for projective geometry (PG) outer code, and may be employed to form a parity check matrix for QC-LDPC inner code by dispersing each entry in a base matrix using, for example, a circulant permutation matrix in accordance with various embodiments of the present principles. A QC-LDPC base matrix generator 530 may be employed to generate a base matric for QC-LDPC inner code over a GF (q) which satisfies, for example, an RC constraint (e.g., with girth of at least 6). An information output sequence cascade 540 may be employed to cascade x information output sequences of outer code to satisfy the coding rate of inner code in accordance with the present principles.

In one embodiment, inner and/or outer encoders 550 may be employed to iteratively encode information data sequences to generate, for example, an (8000, 5600) concatenated code with a selected target code rate (e.g., 0.7) in accordance with the present principles. A transmitter 560 may transmit the concatenated code, which may be received by a receiver 570. Inner/Outer and/or Outer/Inner decoders 580 may be employed to perform Inner/Outer two-phase decoding and/or Outer/Inner two phase decoding in accordance with various embodiments of the present principles. A controller 590 may be employed to control, using a processor (e.g., hardware processor) data transport over one or more transmission mediums (e.g., fiber optic cable) by controlling, for example, matrix generation, encoders (e.g., inner/outer), transmitters, receivers, and decoders (e.g., Inner/Outer, Outer/Inner) in accordance with various embodiments of the present principles. In one embodiment, during cascading concatenation, let C$_{FG}$ be an (n$_0$, k$_0$) cyclic FG-LCPC code given by the null space of a circulant matrix H$_{FG}$. Let d$_0$ be the minimum distance of C$_{FG}$. In one embodiment, a Tanner graph of C$_{FG}$ has no trapping sets of sizes d$_0$−3 or smaller. Let c be a positive integer and let C$_{FF}$ be a (cn$_0$+r, cn$_0$) QC-FF-LDPC code. The code C$_{FF}$ is given by the null space of an RC constrained λ×(cn$_0$+r) parity-check matrix H$_{FF}$ constructed by the CPM-dispersion of a 2×2 constrained base matrix over a finite field GF(q). Note that λ≥r, since the parity-check matrix H$_{FF}$ of C$_{FF}$ may contain redundant rows. In concatenation, we put both codes, C$_{FG}$ and C$_{FF}$, in systematic form.

In concatenation, the FG-LDPC code C$_{FG}$ is used as the outer code and the FF-LDPC code C$_{FF}$ is used as the inner code. Let u be a sequence of ck$_0$ information symbols (binary). Encoding of this information sequence may be performed in two stages. First, we divide this information sequence into c subsequences, denoted by u$_0$, u$_1$, . . . , u$_{c-1}$, each consisting of k$_0$ information symbols and called a message. For 0≤i<c, the message u$_i$ is encoded into a codeword v$_i$ in the outer FGLDPC code C$_{FG}$. Encoding results in c codewords, v$_0$, v$_1$, . . . , v$_{c-1}$ in C$_{FG}$. Cascading these c codewords, we obtain a sequence of v=(v$_0$, v$_1$, . . . , v$_{c-1}$) of cn$_0$ code symbols, called a cascaded codeword. This completes the first stage of encoding. There are 2$_{ck0}$ such cascaded codewords which form a (cn$_0$, ck$_0$) linear code of length cn$_0$, denoted by C$_{FG,casc}$(c) and called a cascaded code of C$_{FG}$.

The minimum distance of C$_{FG,casc}$(c) is also d$_0$. The integer c is called the cascading degree. The parity-check matrix H$_{FG,casc}$(c) of C$_{FG,casc}$(c) is a c×c diagonal array diag(H$_{FG}$, H$_{FG}$, . . . , H$_{FG}$) with c copies of H$_{FG}$ lying on its main diagonal and zero elsewhere. The Tanner graph of G$_{FG,casc}$(c) of C$_{FG,casc}$(c) consists of c disjoint copies of the Tanner graph G$_{FG}$ of C$_{FG}$. It is clear that G$_{FG,casc}$(c) contains no trapping sets of sizes smaller than d$_0$−3. In the second stage of encoding, we use the cascaded codeword v in C$_{FG,casc}$(c) as an information sequence and encode it into a codeword w=(v, p) of cn$_0$+r code symbols in the inner FF-LDPC code C$_{FF}$ for transmission. This completes the second encoding stage of the concatenation of the outer FG-LDPC and inner FF-LDPC codes. The codeword w consists of two parts, v and p. The first part is a cascaded codeword in C$_{FG,casc}$(c) and the second part p consists of r parity-check symbols which are formed by the parity-check matrix H$_{FF}$ of the inner FF-LDPC code C$_{FF}$. These r parity symbols connect the c codewords v$_0$, v$_1$, . . . , v$_{c-1}$ in v. There are $2ck_0$ codewords w in $C_{FG,casc}(c)$. These codewords form a linear $(cn_0+r, ck_0)$ code which is referred to as a type-1 concatenated FG-FF-LDPC code, denoted by $C_{FG,FF,casc}$. Note that $C_{FG,FF,casc}$ is a special subcode of the inner FF-LDPC code.

The above concatenation is an unconventional concatenated coding scheme in which the inner code $C_{FF}$ is longer than the outer code $C_{FG}$. Let (v, p) and (v', p') be any two codewords in $C_{FG,FF,casc}$. Since the distance between v and v' is at least $d_0$, the distance between (v, p) and (v', p') is at least $d_0+d(p, p')$ where $d(p, p')\neq 0$ is the distance between p and p'. This implies that the minimum distance of $C_{FG,FF,casc}$ is at least $d_0+\delta$ where the incremental distance $\delta$ is contributed by the r parity symbols formed by $H_{FF}$. If the minimum distance of $H_{FF}$ is $d_1$, the minimum distance is $d_0d_1$ [1]. Note that $d_0+\delta$ is simply a lower bound on the minimum distance of the concatenated code $C_{FG,FF,casc}$.

In some embodiments, at the end of first stage of concatenated encoding, instead of cascading the c outer codewords $v_0, v_1, \ldots, v_{c-1}$ at the output of the outer code encoder, we interleave the c outer codewords to form an interleaved word $y=(y_0, y_1, \ldots, y_{n0-1})$ which consists of no sections, each containing of c code symbols. For $0 \leq j < n_0$, the j-th section $y_j$ consists of the j-th symbols from $v_0, v_1, \ldots, v_{c-1}$. The interleaving operation is known as the bit interleaving. There are $2_{ck0}$ such interleaved words which form an $(cn_0, ck_0)$ linear code, denoted $C_{FG,inter1}(c)$ and called an interleaved code of the outer FG-LDPC code $C_{FG}$. The interleaved codeword y is then used as the input sequence to the inner encoder and then encoded into a codeword in the inner FF-LDPC code $C_{FF}$ for transmission. This interleaved concatenation of the outer FG-LDPC code $C_{FG}$ and inner FFLDPC code $C_{FF}$ results in a concatenated FG-FF-LDPC of type-2, denoted $C_{FG,FF,inter1}$. The parameter c is now called the interleaving degree.

In accordance with the present principles, the outer FG-LDPC code $C_{FG}$ is capable of correcting $d_0-1$ random erasures where do is the minimum distance of $C_{FG}$ ($d_0=2_s+2$ for a PG-LDPC codes). Then, the interleaved code $C_{FG,inter1}$ (c) is capable of correcting any erasure pattern with erasures distributed in $d_0-1$ or fewer sections in a received interleaved word $y'=(y'_0, y'_1, \ldots, y'_{n0-1})$ of $cn_0$ symbols. After deinterleaving y', each received outer codeword $v'_i$, $0 \leq i < c$, contains at most $d_0-1$ erasures which can be corrected by the outer FG-LDPC code $C_{FG}$. This implies that a single burst of erasures of length $c(d_0-1)$ or shorter can be corrected after deinterleaving. This also implies that during transmission of a interleaved codeword $y=(y_0, y_1, \ldots, y_{n0-1})$, if $d_0-1$ or fewer sections of y are erased, they can be recovered by the outer FG-LDPC code $C_{FG}$ after deinterleaving. Based on the erasure correction feature of the interleaved code $C_{FG,inter1}$ (c) of the outer FG-code, we see that the type-2 concatenated FGFF-LDPC code $C_{FG,FF,inter1}$ is effective in correcting erasures, random or bursts.

The parity-check matrix $H_{FG,inter1}(c)$ of the interleaved code $C_{FG,inter1}(c)$ is obtained by interleaving the $cn_0$ columns of the c×c diagonal array $diag(H_{FG}, H_{FG}, \ldots, H_{FG})$. $H_{FG,inter1}(C)$ consists of $n_0$ c×c diagonal arrays, each having c copies of a column of $H_{FG}$ lying on its main diagonal. Let $\pi_{inter1}$ denote the column permutation corresponding to the interleaving the columns of $diag(H_{FG}, H_{FG}, \ldots, H_{FG})$.

In accordance with various embodiments, the two schemes for decoding a type-1 concatenated FG-FF-LDPC code can be applied to decode a type-2 concatenated FG-FF-LDPC code. However, in decoding a type-2 concatenated FG-FF-LDPC code, deinterleaving and interleaving of the decoded words at the outputs of the inner and outer decoders must be performed before switching from one decoding phase to the other. At the end of the inner decoding phase, the decoded interleaved word must be de-interleaved into c decoded outer codewords before the outer decoding phase begins, and at the end of the outer decoding phase, the c decoded outer codewords must be interleaved before the inner decoding begins. Since the type-1 and type-2 concatenated FG-FF-LDPC codes are combinatorially equivalent, they perform the same over the AWGN channel if the same decoding scheme is used. The two types of codes have the same trapping set structure, minimum distances and fast rate of decoding convergence. For correcting erasures, the outer/inner decoding scheme should be used. In this embodiment, the outer decoder should be implemented to perform both iterative decoding and erasure correction in accordance with the present principles.

In accordance with various embodiments of the present principles, the system 500 achieves a very low error rate of $10^{-15}$ or lower, gaining a NCG higher than 12 due to, for example, the novel design and implementation of inner and outer LDPC coded modulation systems which converge at a higher rate than conventional systems. This high convergence rate may be enabled by utilization of a high number of variable node connections and very low error floor (e.g., due to the high small size of trapping sets), as described with reference to blocks 202, 204, and 206 of FIG. 2).

In one embodiment the system 500 can be used for any or a plurality of different values of coding rate by making small changes in encoding and decoding in accordance with the present principles. The flexible serial turbo structure of the code makes it possible to choose the best combination of decoder structure to find a tradeoff between bit error rate performance and complexity (e.g., described with reference to block 212) in accordance with the present principles. The system 500 provides improved data transport using the ability of the generated code to converge at a higher rate than conventional systems and methods (e.g., with a NCG greater than 12), and the flexible design and implementation of the serial turbo decoders in accordance with various embodiments of the present principles.

Figure 5:
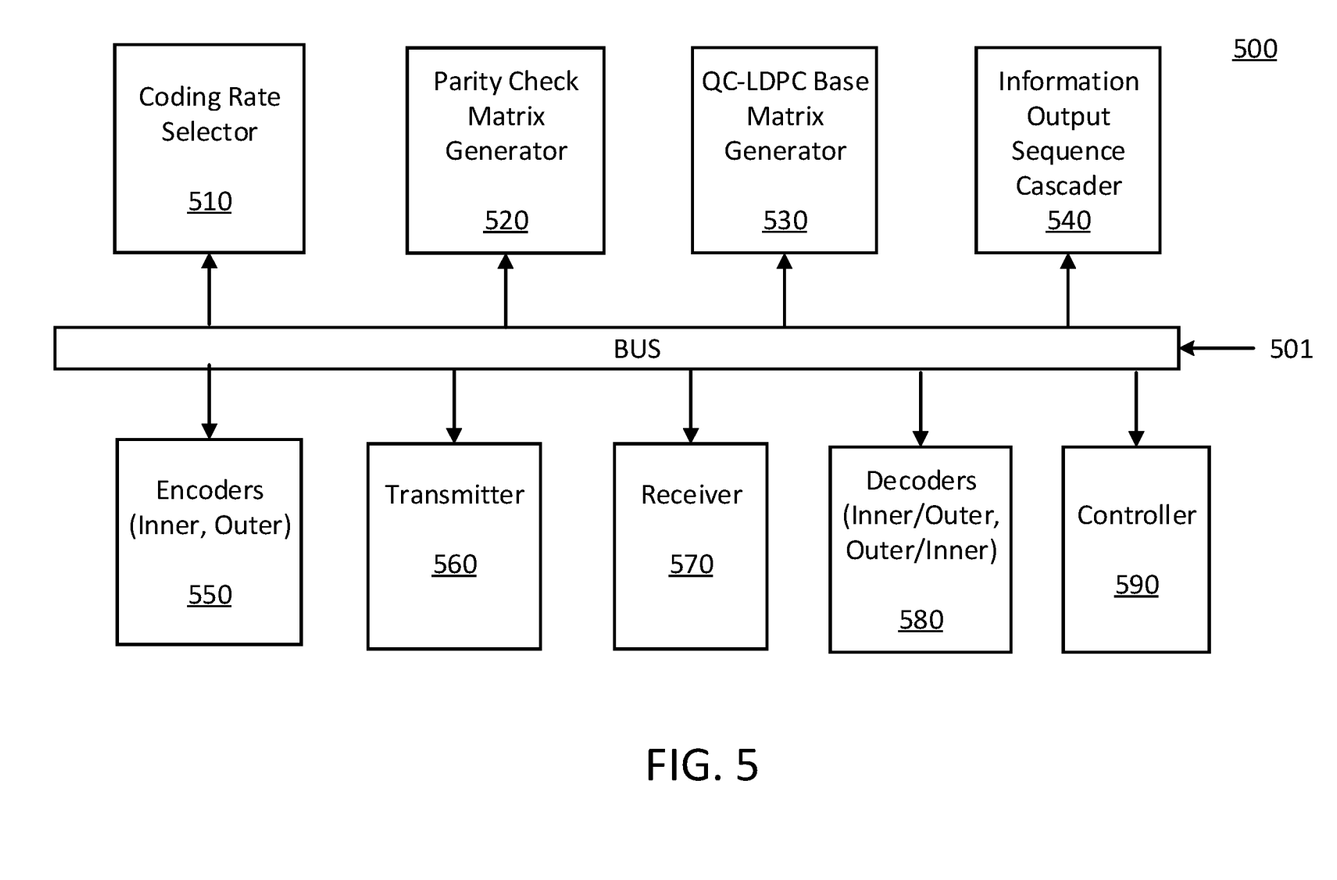
FIG. 5 is a system for data transport using quasi-cyclic (QC) Low Density Parity Check (LDPC) coded modulation with serial turbo decoding, in accordance with the present principles.

In the embodiment shown in FIG. 5, the elements thereof are interconnected by a bus 501. However, in other embodiments, other types of connections can also be used. Moreover, in an embodiment, at least one of the elements of system 500 is processor-based and/or a logic circuit. Further, while one or more elements may be shown as separate elements, in other embodiments, these elements can be combined as one element. The converse is also applicable, where while one or more elements may be part of another element, in other embodiments, the one or more elements may be implemented as standalone elements. These and other variations of the elements of system 500 are readily determined by one of ordinary skill in the art, given the teachings of the present principles provided herein, while maintaining the spirit of the present principles.

Figure 6:
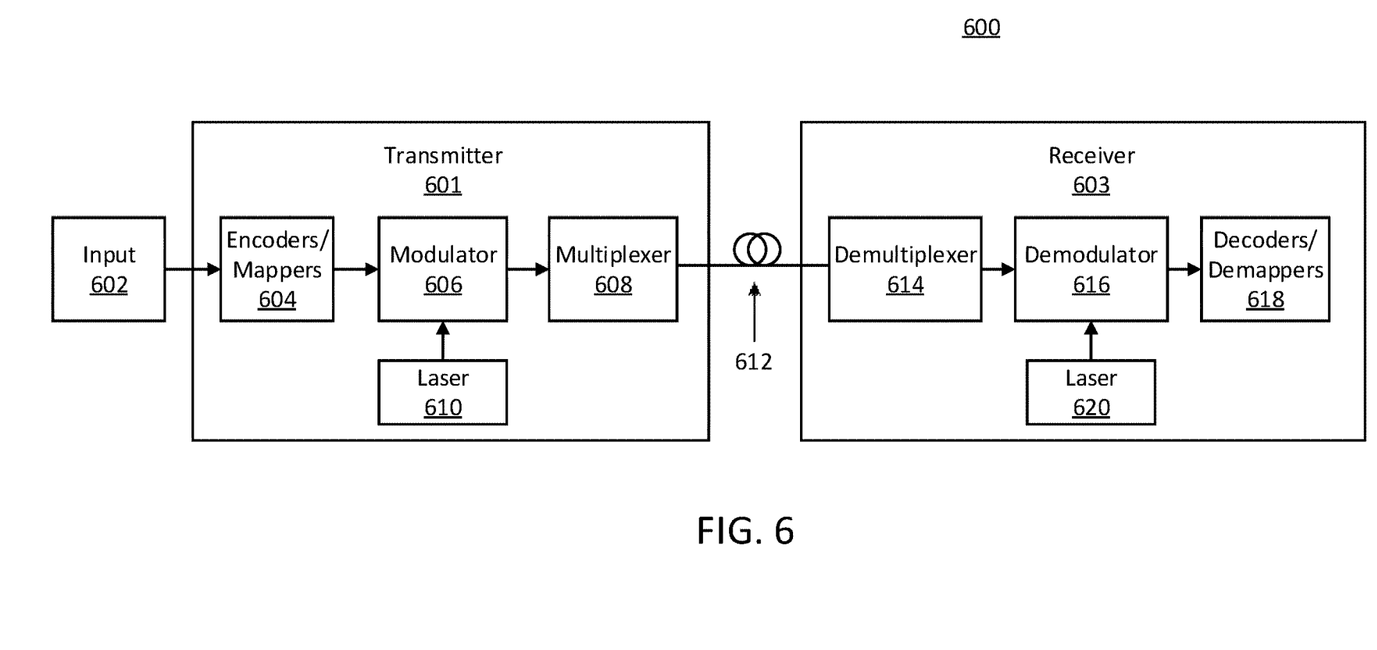
FIG. 6 is a block diagram illustrating a high-level system for data transport using quasi-cyclic (QC) Low Density Parity Check (LDPC) coded modulation with serial turbo decoding, in accordance with the present principles.

Referring now to FIG. 6, a high-level system 600 for data transport using quasi-cyclic (QC) Low Density Parity Check (LDPC) coded modulation with serial turbo decoding is illustratively depicted in accordance with an embodiment of the present principles.

In one embodiment, input data 602 may be received into a transmitter 601, and an incoming bit sequence may be coded into a symbol stream using one or more inner and/or outer encoders/mappers 604. The encoders/mappers are further configured to map the data stream according to a QC-LDPC inner code generated in accordance with the present principles. The data stream may be modulated, using a modulator 606 (e.g., electro-optical modulator), and may be multiplexed using, for example, a polarization division multiplexer or mode-multiplexer in block 608. In some embodiments, the encoded signal may modulated onto a laser beam using a laser 610. The optically multiplexed signals may be transmitted over any of a plurality of transmission mediums 612 (e.g., SMF or FMF) in accordance with various embodiments of the present principles.

The transmitted signals may be received by a receiver 603, and in some embodiments, the receiver 603 may include a laser 620. In one embodiment, the signals may be demultiplexed using a mode demultiplexer 614 followed by, for example, a polarization diversity coherent detector (not shown). The signals may be demodulated using a demodulator 616, and may be decoded (e.g., two-phase decoding) and demapped using one or more Inner/Outer and/or Outer/Inner decoders/demappers 618 in accordance with the present principles. The decoding may continue until a threshold condition has been reached (e.g., entire decoding is successful, present maximum number of overall inner/outer and/or outer/inner decoding iterations is reached) in accordance with various embodiments of the present principles.

It is noted that although the above configuration is illustratively depicted according to the present principles, other configurations may also be employed for data transport using two phase decoding (e.g., Inner/Outer decoding, Outer/Inner decoding) in accordance with various embodiments of the present principles.

Figure 7:
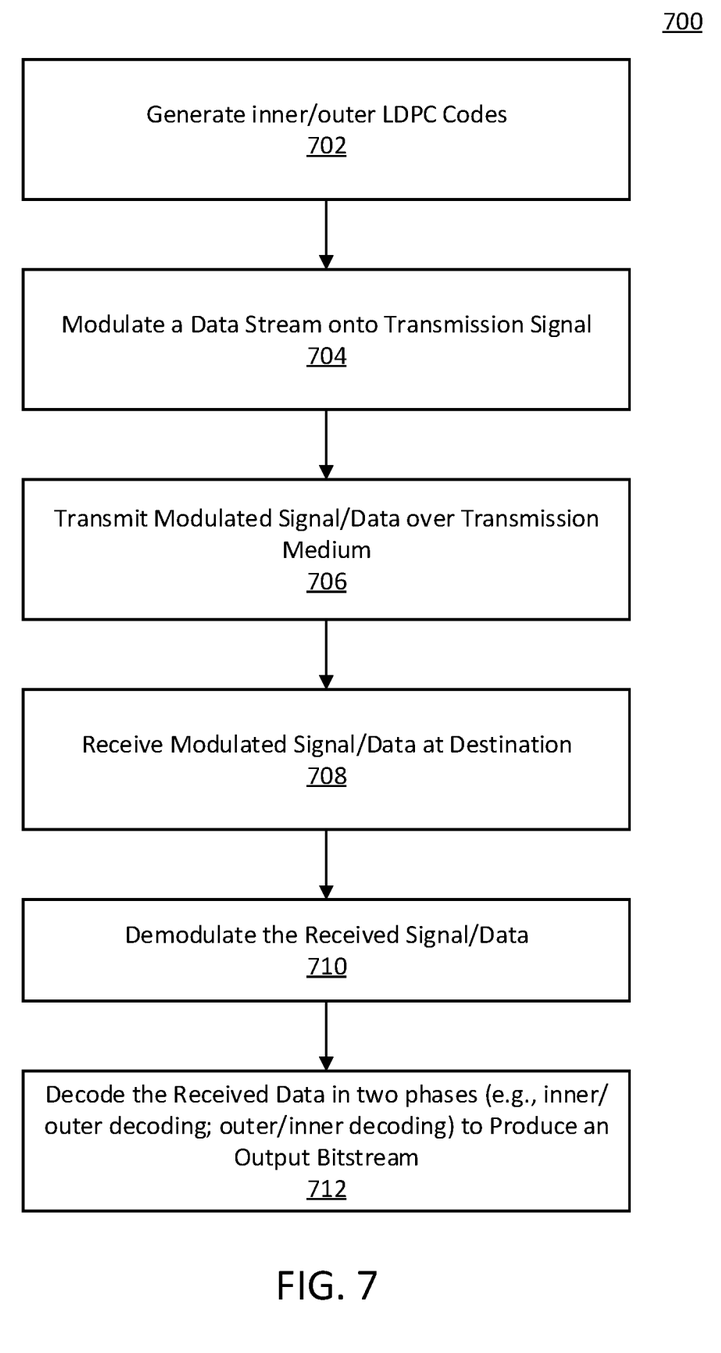

Referring now to FIG. 7, a high-level method for optical communication using quasi-cyclic (QC) Low Density Parity Check (LDPC) coded modulation with serial turbo decoding is illustratively depicted according to one embodiment of the present principles.

In one embodiment, in block 702, an incoming bit sequence may be coded into a symbol stream according a QC-LDPC code generated in accordance with the present principles. In block 704, the symbol stream may be modulated onto a transmission signal such as, e.g., a laser beam or another appropriate medium. In block 706, the modulated transmission signal may be transmitted using any of a plurality of transmission mediums, including, for example, a fiber optic cable.

In block 708, the modulated transmission signal is received from the transmission medium at the destination (e.g., receiver). In block 710, the modulated signal may be demodulated to detect the corresponding symbols. In block 712, the symbols may be decoded in two phases using Inner/Outer decoding and/or Outer/Inner decoding to produce an output bitstream in accordance with various embodiments of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A method for data transport in optical communications systems, comprising:
    generating concatenated code with a particular target code rate by encoding a received information sequence by constructing an outer and inner quasi cyclic-low-density parity check (QC-LDPC) code, the encoding comprising:
        dividing the received information sequence into a plurality of messages of equal length;
        encoding each of the messages into a codeword to generate a plurality of outer codewords;
        cascading the plurality of outer codewords to generate a bit sequence; and
        executing inner encoding to encode each of the plurality of outer codewords into codewords in QC-LDPC inner code, the dividing the received information sequence, encoding each of the messages into the codeword, cascading the plurality of outer codewords, and the executing the inner encoding being iteratively executed to continually improve the code rate until the target code rate is achieved; and
    decoding a received data stream based on the QC-LDPC inner code using two-phase decoding, the decoding comprising iteratively performing at least one of inner/outer and outer/inner decoding until a threshold condition is reached.

2. The method as recited in claim 1, wherein the encoding further comprises:
    generating a parity check matrix for a projective geometry (PG) outer code;
    generating a base matrix for QC-LDPC inner code over a Galois Field (GF) to satisfy a row-column (RC) constraint; and
    forming a parity check matrix for the QC-LDPC inner code by dispersing each entry in the base matrix using a circulant permutation matrix.

3. The method as recited in claim 1, wherein the decoding further comprises iteratively switching between inner and outer decoding until a target error performance has been reached.

4. The method as recited in claim 1, wherein the inner/outer decoding further comprises:
    setting a maximum number of inner decoding iterations, and checking a syndrome of a decoded word based on a parity check matric of the inner code at the end of each inner decoding iteration;
    setting a maximum number of outer decoding iterations, and decoding all failed words outputted by an inner decoder; and
    iteratively performing inner/outer decoding until the entire decoding is successful or a preset maximum number of overall inner/outer decoding iterations is reached.

5. The method as recited in claim 4, wherein the outer/inner decoding is performed by executing the steps of the inner/outer decoding in reverse order.

6. The method as recited in claim 1, wherein the QC-LDPC code is of length 8000 bits and rate 0.7 with a bit error rate (BER) of $10^{-15}$ with a net coding gain (NCG) of greater than 12 dB.

7. A system for data transport in optical communications systems, comprising:
    a transmitter, including a processor, the processor being configured for:
        generating concatenated code with a particular target code rate by encoding a received information sequence by constructing an outer and inner quasi cyclic-low-density parity check (QC-LDPC) code, the encoding comprising:
  dividing the received information sequence into a plurality of messages of equal length;
  encoding each of the messages into a codeword to generate a plurality of outer codewords;
  cascading the plurality of outer codewords to generate a bit sequence; and
  executing inner encoding to encode each of the plurality of outer codewords into codewords in QC-LDPC inner code, the dividing the received information sequence, encoding each of the messages into the codeword, cascading the plurality of outer codewords, and the executing the inner encoding being iteratively executed to continually improve the code rate until the target code rate is achieved; and
transmitting a data stream in accordance with the QC-LDPC inner code over a transmission medium.

8. The system as recited in claim 7, further comprising a receiver configured to decode a received data stream based on the QC-LDPC inner code using two-phase decoding, the decoding comprising iteratively performing at least one of inner/outer and outer/inner decoding until a threshold condition is reached.

9. The system as recited in claim 7, wherein the encoding further comprises:
  generating a parity check matrix for a projective geometry (PG) outer code;
  generating a base matrix for QC-LDPC inner code over a Galois Field (GF) to satisfy a row-column (RC) constraint; and
  forming a parity check matrix for the QC-LDPC inner code by dispersing each entry in the base matrix using a circulant permutation matrix.

10. The system as recited in claim 8, wherein the receiver is further configured to iteratively switch between inner and outer decoding until a target error performance has been reached.

11. The system as recited in claim 8, wherein the inner/outer decoding comprises:
  setting a maximum number of inner decoding iterations, and checking a syndrome of a decoded word based on a parity check matric of the inner code at the end of each inner decoding iteration;
  setting a maximum number of outer decoding iterations, and decoding all failed words outputted by an inner decoder; and
  iteratively performing inner/outer decoding until the entire decoding is successful or a preset maximum number of overall inner/outer decoding iterations is reached.

12. The system as recited in claim 8, wherein the outer/inner decoding is performed by executing the steps of inner/outer decoding in reverse order.

13. The system as recited in claim 7, wherein the QC-LDPC code is of length 8000 bits and rate 0.7 with a bit error rate (BER) of $10^{-15}$ with a net coding gain (NCG) of greater than 12 dB.

14. A system for data transport in optical communications systems, comprising:
  a receiver, including a processor, the processor being configured to:
    decode a received data stream based on a QC-LDPC inner code using two-phase decoding, the received data stream including generated concatenated code with a particular target code rate, the decoding comprising iteratively performing at least one of inner/outer and outer/inner decoding until a threshold condition is reached, the inner/outer decoding further comprising:
      setting a maximum number of inner decoding iterations, and checking a syndrome of a decoded word based on a parity check matric of the inner code at the end of each inner decoding iteration;
      setting a maximum number of outer decoding iterations, and decoding all failed words outputted by an inner decoder; and
      iteratively performing the inner/outer decoding until the entire decoding is successful or a preset maximum number of overall inner/outer decoding iterations is reached.

15. The system as recited in claim 14, further comprising:
a transmitter, including a hardware processor, the processor being configured for:
  generating the concatenated code with a particular target code rate by encoding a received information sequence by constructing an outer and inner quasi cyclic-low-density parity check (QC-LDPC) code, the encoding comprising:
    dividing the received information sequence into a plurality of messages of equal length;
    encoding each of the messages into a codeword to generate a plurality of outer codewords;
    cascading the plurality of outer codewords to generate a bit sequence; and
    executing inner encoding to encode each of the plurality of outer codewords into codewords in QC-LDPC inner code, the dividing the received information sequence, encoding each of the messages into the codeword, cascading the plurality of outer codewords, and the executing the inner encoding being iteratively executed to continually improve the code rate until the target code rate is achieved; and
  transmitting a data stream in accordance with the QC-LDPC inner code over a transmission medium.

16. The system as recited in claim 15, wherein the encoding further comprises:
  generating a parity check matrix for a projective geometry (PG) outer code;
  generating a base matrix for QC-LDPC inner code over a Galois Field (GF) to satisfy a row-column (RC) constraint; and
  forming a parity check matrix for the QC-LDPC inner code by dispersing each entry in the base matrix using a circulant permutation matrix.

17. The system as recited in claim 14, wherein the receiver is further configured to iteratively switch between inner and outer decoding until a target error performance has been reached.

18. The system as recited in claim 14, wherein the outer/inner decoding is performed by executing the steps of inner/outer decoding in reverse order.

19. The system as recited in claim 14, wherein the QC-LDPC code is of length 8000 bits and rate 0.7 with a bit error rate (BER) of $10^{-15}$ with a net coding gain (NCG) of greater than 12 dB.

20. The system as recited in claim 15, wherein the cascading further comprises cascading output sequences of outer code to satisfy a coding rate of the inner code.

* * * * *